United States Patent
Jung et al.

(10) Patent No.: US 8,253,154 B2
(45) Date of Patent: Aug. 28, 2012

(54) LENS FOR LIGHT EMITTING DIODE PACKAGE

(75) Inventors: Soo Jin Jung, Seoul (KR); Joong Kon Son, Seoul (KR); Gwan Su Lee, Gyunggi-do (KR)

(73) Assignee: Samsung Led Co., Ltd., Gyunggi-Do (KR)

(*) Notice: Subject to any disclaimer, the term of this patent is extended or adjusted under 35 U.S.C. 154(b) by 72 days.

(21) Appl. No.: 12/607,694

(22) Filed: Oct. 28, 2009

(65) Prior Publication Data

US 2010/0213480 A1 Aug. 26, 2010

(30) Foreign Application Priority Data

Feb. 23, 2009 (KR) .................. 10-2009-0015007

(51) Int. Cl.
*H01L 29/22* (2006.01)
*H01L 29/227* (2006.01)
*H01L 33/00* (2010.01)
*H01L 29/24* (2006.01)
*H01L 31/0203* (2006.01)

(52) U.S. Cl. ............ 257/98; 257/95; 257/99; 257/100; 257/434; 257/E31.13; 257/E33.068; 257/E33.073; 257/E33.074

(58) Field of Classification Search .............. 257/95, 257/98, 434, E33.068, E33.073, E33.074, 257/99, 100, E31.13
See application file for complete search history.

(56) References Cited

U.S. PATENT DOCUMENTS

| 6,332,693 | B1 * | 12/2001 | Dove et al. ................. 362/19 |
| 6,682,657 | B2 * | 1/2004 | Dutton et al. .............. 216/2 |
| 6,831,786 | B2 * | 12/2004 | Bourdelais et al. ......... 359/599 |
| 6,900,941 | B2 * | 5/2005 | Kaminsky et al. .......... 359/599 |
| 6,975,294 | B2 * | 12/2005 | Manni et al. ............... 345/83 |
| 7,113,333 | B2 * | 9/2006 | Kamijima ................... 359/456 |
| 7,207,706 | B2 * | 4/2007 | Leu et al. ................... 362/612 |
| 7,262,437 | B2 * | 8/2007 | Bogner et al. .............. 257/95 |
| 7,315,048 | B2 * | 1/2008 | Fung et al. ................. 257/95 |
| 7,359,596 | B2 * | 4/2008 | Sugiyama et al. .......... 385/33 |
| 7,375,312 | B2 * | 5/2008 | Butterworth ............... 250/214 R |
| 7,520,641 | B2 * | 4/2009 | Minano et al. ............. 362/297 |
| 7,670,031 | B2 * | 3/2010 | Ogawa et al. .............. 362/311.02 |
| 7,745,891 | B2 * | 6/2010 | Delapierre ................. 257/415 |
| 7,780,317 | B2 * | 8/2010 | Schroll et al. .............. 362/309 |
| 7,790,485 | B2 * | 9/2010 | Nomura et al. ............ 438/27 |

(Continued)

FOREIGN PATENT DOCUMENTS

JP 11-142610 A 5/1999

(Continued)

OTHER PUBLICATIONS

Japanese Office Action, w/ English translation thereof, issued in Japanese Patent Application No. 2009-258363, dated Nov. 1, 2011.

(Continued)

*Primary Examiner* — Ida M Soward
(74) *Attorney, Agent, or Firm* — McDermott Will & Emery LLP

(57) ABSTRACT

A lens for a light emitting diode package and a light emitting diode package having the same have simple structures and increase light extraction efficiency by preventing light emitted from a light emitting diode chip from being internally reflected by a lens surface through a structural change in the lens surface.

4 Claims, 3 Drawing Sheets

U.S. PATENT DOCUMENTS

| | | | |
|---|---|---|---|
| 8,144,399 B2* | 3/2012 | Steenblik et al. | 359/618 |
| 2003/0170442 A1 | 9/2003 | Kaminsky et al. | |
| 2004/0253549 A1* | 12/2004 | Ogusu | 430/322 |
| 2006/0044806 A1* | 3/2006 | Abramov et al. | 362/337 |
| 2006/0120085 A1* | 6/2006 | Hsieh et al. | 362/338 |
| 2007/0109438 A1* | 5/2007 | Duparre et al. | 348/335 |
| 2007/0141739 A1* | 6/2007 | Thompson et al. | 438/28 |
| 2007/0170449 A1* | 7/2007 | Anandan | 257/98 |
| 2007/0257610 A1* | 11/2007 | Shen | 313/512 |
| 2008/0169480 A1* | 7/2008 | Weng et al. | 257/98 |
| 2008/0179614 A1* | 7/2008 | Wang et al. | 257/98 |
| 2008/0239513 A1* | 10/2008 | Karszes et al. | 359/741 |
| 2009/0014737 A1* | 1/2009 | Tsai et al. | 257/98 |
| 2009/0050910 A1* | 2/2009 | Sun | 257/89 |
| 2009/0213585 A1* | 8/2009 | Chern et al. | 362/231 |
| 2009/0321759 A1* | 12/2009 | Xu | 257/98 |
| 2010/0134895 A1* | 6/2010 | Hoffman et al. | 359/621 |
| 2010/0295014 A1* | 11/2010 | Kang et al. | 257/13 |

FOREIGN PATENT DOCUMENTS

| | | |
|---|---|---|
| JP | 2004-038146 A | 2/2004 |
| JP | 2011-526083 A | 9/2011 |
| KR | 10-0691440 B1 | 2/2007 |
| WO | WO 2009/158313 A1 | 12/2009 |

OTHER PUBLICATIONS

Japanese Office Action with English translation issued in application No. 2009-258363 issued on Jun. 5, 2012.

* cited by examiner

LENS FOR LIGHT EMITTING DIODE PACKAGE

CROSS-REFERENCE TO RELATED APPLICATIONS

This application claims the priority of Korean Patent Application No. 10-2009-0015007 filed on Feb. 23, 2009, in the Korean Intellectual Property Office, the disclosure of which is incorporated herein by reference.

BACKGROUND OF THE INVENTION

1. Field of the Invention

The present invention relates to a lens for a light emitting diode package and a light emitting diode package having the same, and more particularly, to a lens for a light emitting diode package and a light emitting diode package having the same that can increase light extraction efficiency by altering the angle at which light reaches the inside of a lens, within the critical angle through a structural change in the lens surface.

2. Description of the Related Art

Light emitting diodes (LEDs) refer to semiconductor devices emitting light of various colors by forming light sources through changes in compound semiconductor materials, such as GaAs, AlGaAs, GaN or InGaInP.

In general, the characteristics of LED devices are determined by several factors, such as color, luminance and range of luminous intensity. The characteristics of these LED devices are primarily determined by compound semiconductor materials, used to manufacture LED devices. Secondarily, the characteristics of LED devices are also greatly affected by package structures used to mount LED chips therein. In order to obtain high luminance and luminance distribution according to the user's needs, the above-described primary factors, based on material development, are limited. Therefore, package structures have attracted much attention to improve the performance of LEDs.

Since these LED packages need to ensure thermal and electrical reliability and, at the same time, show optimal optical characteristics, they have different configurations from general semiconductor packages.

Recently, as light emitting diode packages have been variously developed into automotive lighting devices, illumination devices and flashes, packages and lenses have been designed to satisfy viewing angles suited for different purposes and to increase light extraction efficiency.

Efforts have been made to increase light extraction efficiency by applying a texture to the upper surface of LED chips, forming a tap, shaped like a chip, or forming a reflective surface when manufacturing LED chips. However, these configurations leave much to be desired.

SUMMARY OF THE INVENTION

An aspect of the present invention provides a lens for a light emitting diode package and a light emitting diode package having the same that can increase light extraction efficiency by reducing the amount of light, emitted from a light emitting diode chip, being totally reflected internally by a lens surface through a structural change in the lens surface.

According to an aspect of the present invention, there is provided a lens for a light emitting diode package that covers a light emitting diode chip mounted in a package body, the lens including: a plurality of refractive lenses each having a sub-radius of curvature smaller than one main radius of curvature of an outer surface of the lens, and raised along the main radius of curvature of the outer surface of the lens protruding above the package body.

The refractive lenses may be fly's eye lenses.

A ratio of the sub-radius of curvature to the main radius of curvature of the refractive lenses may satisfy the following equation, $$2\sqrt{2} < R/r < 1 \qquad \text{Equation 1,}$$

where R is a main radius of curvature, and r is a sub-radius of curvature.

A distance between the refractive lenses arranged in a fly's eye pattern and the sub-radius of curvature of the refractive lenses may satisfy the following equation, $$d = r/2 \qquad \text{Equation 2,}$$

wherein d is a distance between refractive lenses, and r is a sub-radius of curvature.

The refractive lenses may be provided at intersections of a plurality of horizontal lines and vertical lines depressed below the outer surface at predetermined intervals.

The refractive lenses may be arranged in a convex mesh by the plurality of horizontal lines and vertical lines.

According to another aspect of the present invention, there is provided a light emitting diode package including: a package body including a cavity having an upper opening through which a mounting unit is exposed; a lead frame supported by the package body; at least one light emitting diode chip mounted onto the mounting unit and electrically connected to the lead frame; and a lens having an outer surface thereof, protruding above the package body and having one main radius of curvature, and having a plurality of refractive lenses each having a sub-radius of curvature smaller than the main radius of curvature, and raised on the outer surface along the main radius of curvature.

The refractive lenses may be fly's eye lenses.

A ratio of the sub-radius of curvature to the main radius of curvature of the refractive lenses satisfies the following equation, $$2\sqrt{2} < R/r < 1 \qquad \text{Equation 1,}$$

where R is a main radius of curvature, and r is a sub-radius of curvature.

A distance between the refractive lenses arranged in a fly's eye pattern and the sub-radius of curvature of the refractive lenses may satisfy the following equation, $$d = r/2 \qquad \text{Equation 2,}$$

wherein d is a distance between refractive lenses, and r is a sub-radius of curvature.

The refractive lenses may be provided at intersections of a plurality of horizontal lines and vertical lines depressed below the outer surface at predetermined intervals.

The refractive lenses may be arranged into a convex mesh by the plurality of horizontal lines and vertical lines.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

A lens for a light emitting diode package and a light emitting diode package having the same, according to exemplary embodiments of the present invention, will now be described in detail with reference to the accompanying drawings.

Figure 1:
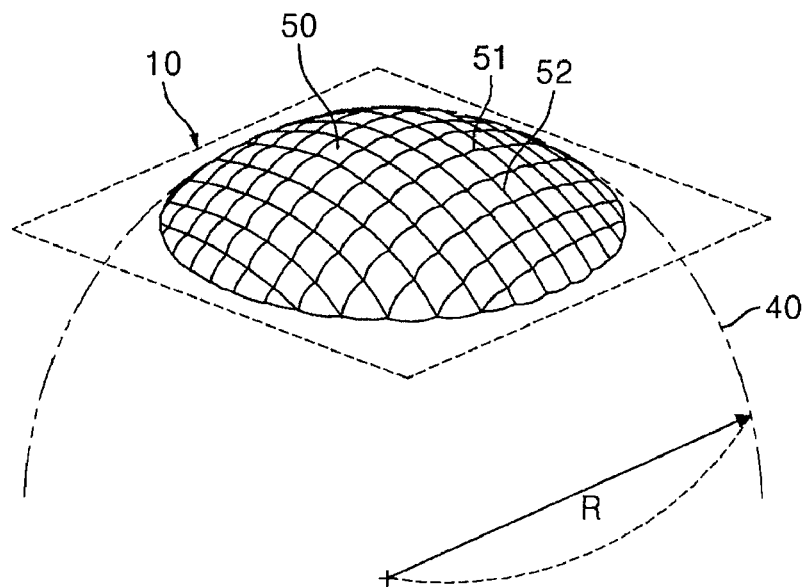
FIG. 1 is a perspective view schematically illustrating a lens for a light emitting diode package according to an exemplary embodiment of the present invention.
Figure 2:
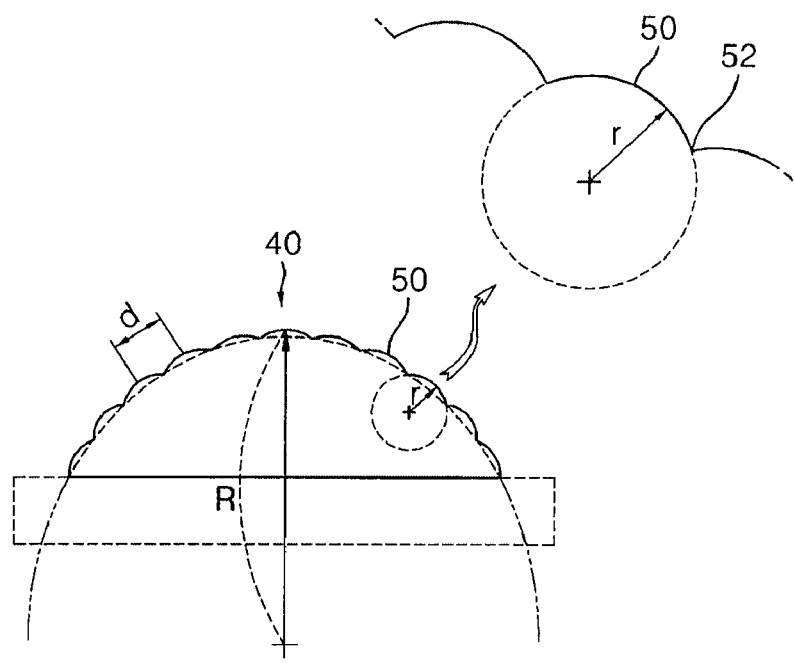
FIG. 2 is a cross-sectional view illustrating in detail the design conditions of refractive lenses of the lens for the light emitting diode package, shown in FIG. 1.

FIG. 1 is a perspective view schematically illustrating a lens for a light emitting diode package according to an exemplary embodiment of the invention. FIG. 2 is a cross-sectional view illustrating in detail the design conditions of refractive lenses of the lens for a light emitting diode package, shown in FIG. 1.

As shown in FIGS. 1 and 2, a lens 40 for a light emitting diode package (hereinafter, simply referred to as a "lens") according to this embodiment is a light-transmissive molding member that covers a light emitting diode chip (not shown) mounted within a package body 10 to thereby seal the light emitting diode chip.

The lens 40 has a convex lens that is shaped like a dome that protrudes above the package body 10 to control the light distribution of the light emitting diode chip, so that light can be irradiated onto a wider area.

The lens 40 may be provided by injecting silicone or epoxy resins into a cavity (not shown) of the package body 10 to perform a molding process. Alternatively, the lens 40, formed by injection molding, may be placed onto the upper part of the package body 10.

The invention is not limited thereto, and various kinds of light-transmissive resins, such as polycarbonate resins, may be used.

Particularly, the outer surface of the lens 40 that protrudes above the package body 10 has one main radius of curvature R. A plurality of refractive lenses 50, each of which has a sub-radius of curvature r smaller than the main radius of curvature R, are raised on the outer surface along the main radius of curvature R.

Preferably, the refractive lenses 50 are arranged into a fly's eye lens array having a predetermined pattern in which the plurality of refractive lenses 50 are disposed adjacent to each other along the convex outer surface.

That is, the fly's eye pattern is formed in such a way that the plurality of convex refractive lenses 50 are formed on the surface of the single convex lens 40. Thus, when light, emitted from the light emitting diode chip (not shown), reaches the convex outer surface of the lens 40, that is, the interface of the lens 40 that contacts the atmosphere, the refracting surfaces of the refractive lenses 50 allow light to enter at an angle within the critical angle.

Therefore, light, emitted from the light emitting diode chip, is not totally reflected from the surface of the lens 40 and reflected back inside the lens 40 so that a reduction in light extraction efficiency can be prevented.

The refractive lenses 50 are formed at intersections of a plurality of horizontal lines 51 and vertical lines 52 that are depressed below the surface of the lens 40 at predetermined intervals along the surface of the lens 40.

As shown in the drawings, the refractive lenses 50 having the fly's eye pattern are arranged into a rectangular mesh by the plurality of horizontal lines 51 and vertical lines 52.

The refractive lenses 50 each have a dome-shaped structure having a small sub-radius of curvature like the dome shape of the lens 40 having the predetermined main radius of curvature R.

Here, the relationship between the main radius of curvature R of the lens 40 and the sub-radius of curvature r of the refractive lenses 50 satisfies the following equation, $$2\sqrt{2} < R/r < 1 \qquad \text{Equation 1.}$$

If a ratio of the sub-radius of curvature r of the refractive lenses 50 to the main radius of curvature R of the lens 40 is smaller than "$2\sqrt{2}$", light, generated from a light source, has an angle with respect to the inner surface of the lens greater than the critical angle and thus is reflected back inside the lens 40. Therefore, it is difficult to maximize an increase rate of light extraction efficiency.

When a ratio of the sub-radius of curvature r of the refractive lenses 50 to the main radius of curvature R of the lens 40 is greater than "1", the range of the critical angle that can be expanded through the sub-radius of curvature r is reduced, and at the same time, light that can be emitted through the main radius of curvature R of the lens, is also likely to undergo total internal reflection.

Meanwhile, the relationship between the sub-radius of curvature r of the refractive lenses 50 and a distance d between the refractive lenses 50 having the fly's eye pattern satisfies the following equation, $$d = r/2 \qquad \text{Equation 2.}$$

Equation 2 shows the relationship between the sub-radius of curvature r and the distance d between the refractive lenses 50 according to this embodiment of the invention. The relationship between the distance d and the sub-radius of curvature r is not limited to Equation 2.

Figure 6:
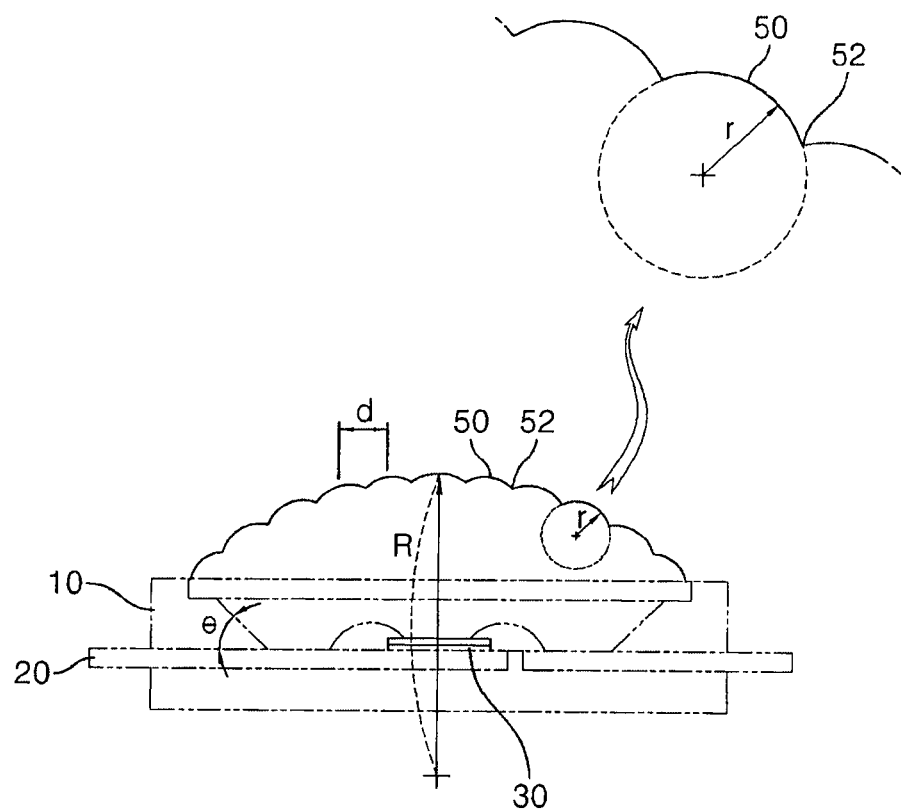
FIG. 6 is a cross-sectional view illustrating in detail the design conditions of a lens and refractive lenses in the light emitting diode package, shown in FIG. 3.

The numerical values for the design of the lens 40 and the refractive lenses 50, that is, the radius of curvature R and the height of the lens 40, and the shape (fly's eye pattern) and the sub-radius of curvature r of the refractive lens 50, as shown in FIG. 6, may be optimized according to the conditions of the package body 10, such as a slope (θ) of the reflective surface of a cavity 13 of the package body 10 on the lens 40 is mounted, and the size thereof, and a distance to the light emitting diode chip.

According to this embodiment of the invention, when the reflective surface of the cavity 13 has a slope of 45 degrees, the radius of curvature R of the lens 40 is 3 mm, and the sub-radius of curvature r of the refractive lenses 50 is 0.9 mm, the maximum light extraction efficiency can be obtained.

Referring to FIGS. 3 through 6, a light emitting diode package having a lens for a light emitting diode package according to an exemplary embodiment of the invention will be described.

Figure 3:
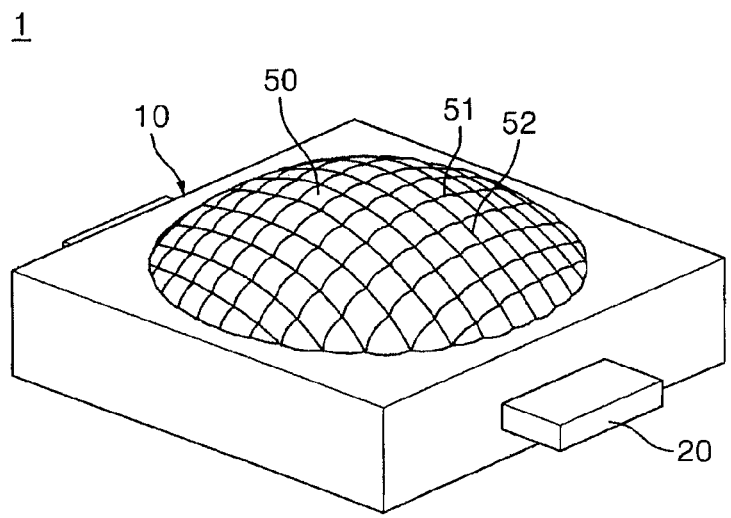
FIG. 3 is a perspective view schematically illustrating a light emitting diode package according to an exemplary embodiment of the present invention.
Figure 4:
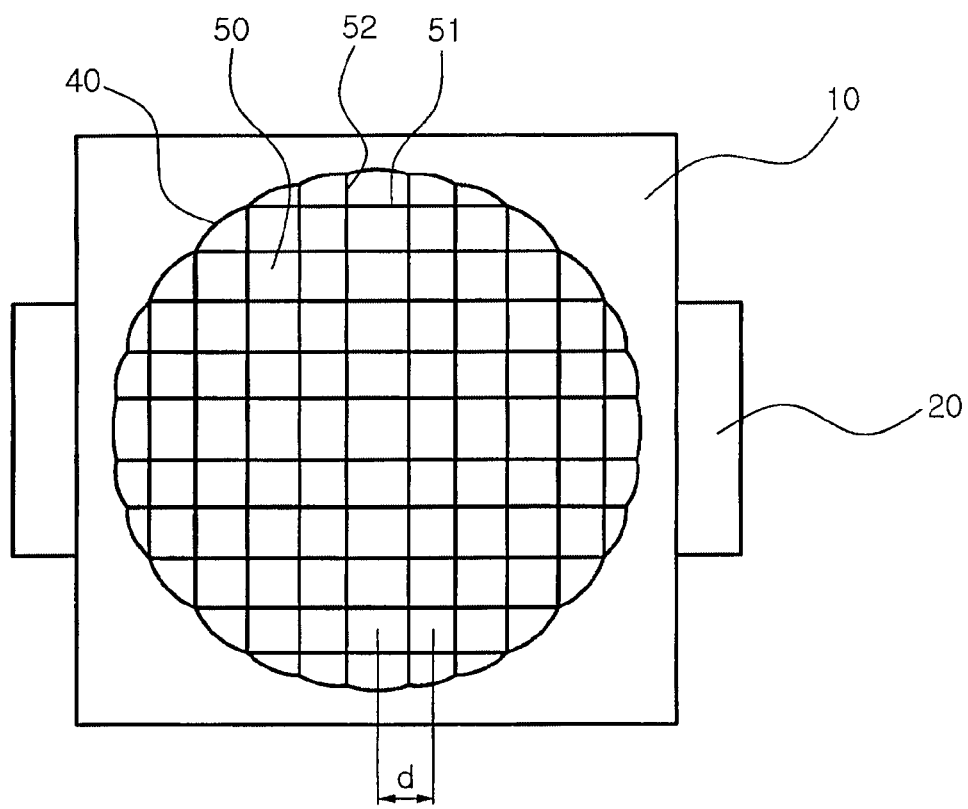
FIG. 4 is a plan view illustrating the light emitting diode package, shown in FIG. 3.
Figure 5:
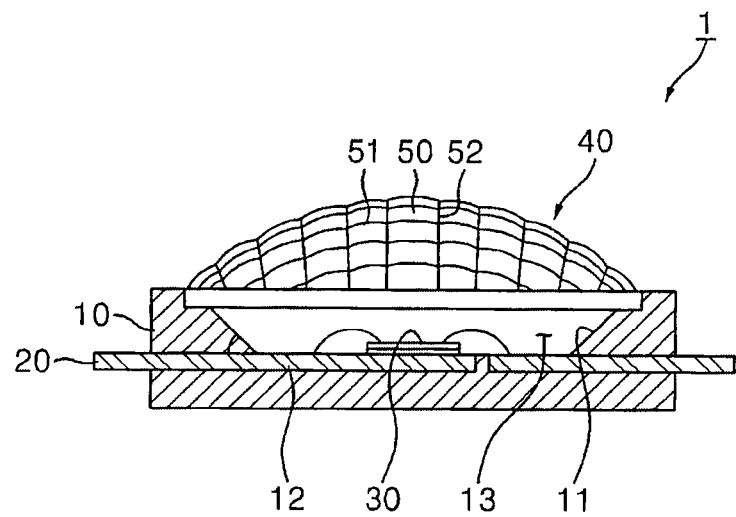
FIG. 5 is a cross-sectional view illustrating the light emitting diode package, shown in FIG. 3.

FIG. 3 is a perspective view schematically illustrating a light emitting diode package according to an exemplary embodiment of the invention. FIG. 4 is a plan view illustrating the light emitting diode package, shown in FIG. 3. FIG. 5 is a cross-sectional view illustrating the light emitting diode package, shown in FIG. 3. FIG. 6 is a cross-sectional view illustrating in detail the design conditions of a lens and refractive lenses 50 in the light emitting diode package, shown in FIG. 3.

As shown in FIGS. 3 through 5, a light emitting diode package 1 having a lens for a light emitting diode package according to this embodiment includes a package body 10, lead frames 20, a light emitting diode chip 30, and a lens 40.

The package body 10 includes a cavity 13 having a predetermined size. The cavity 13 has an upper opening through which a mounting unit 12, having the light emitting diode chip 30 mounted thereon, is exposed.

In the package body 10, the inner surface of the cavity 13 is inclined downwardly toward the mounting unit 12 to thereby form a reflective surface 11.

Therefore, light, emitted from the light emitting diode chip 30, is reflected from the reflective surface 11 and moves upwards, thereby increasing luminous efficiency. In order to further increase luminous efficiency, reflective films with high reflectivity may further be included on the reflective surface 11.

The lead frames 20 are supported by the package body 10 and are electrically connected to an external power supply to supply power to the light emitting diode chip 30.

The lead frames 20 are electrically connected to the light emitting diode chip 30, mounted onto the mounting unit 12 on the bottom surface of the cavity 13, by wire bonding or flip-chip bonding.

Preferably, a heat sink (not shown) may further be provided under the mounting unit 12 to efficiently dissipate heat.

The lead frames 20 may be formed of a conductive material in order to effectively supply currents.

The light emitting diode chip 30 is a type of semiconductor device that emits light with a predetermined wavelength upon receiving power from an external power supply. In this embodiment, the single light emitting diode chip 30 is provided at the center of the mounting unit 12.

However, the invention is not limited thereto, and a plurality of light emitting diode chips 30 may be provided. Here, the light emitting diode chips 30 may include a combination of a blue light emitting diode chip, a red light emitting diode chip and a green light emitting diode chip.

The lens 40, which is shaped like a dome, is provided on the package body 10 so as to cover and protect the light emitting diode chip 30 that is mounted within the cavity 13.

The lens 40 may be provided by injecting plastic resins into the cavity 13 of the package body 10 to perform a molding process. Alternatively, the lens 40, formed by injection molding, may be placed onto the upper part of the package body 10.

Particularly, the outer surface of the lens 40 that protrudes above the package body 10 has one main radius of curvature R, and a plurality of refractive lenses 50 each having a sub-radius of curvature r smaller than the main radius of curvature R are raised on the outer surface of the lens 40 along the main radius of curvature R.

Preferably, the refractive lenses 50 may be arranged into a fly's eye lens array having a predetermined pattern in which the plurality of refractive lenses 50 are disposed adjacent to each other along the convex outer surface of the lens 40.

That is, the fly's eye pattern is formed in such a way that the plurality of convex refractive lenses 50 are formed on the surface of the single convex lens 40. Thus, when light, emitted from the light emitting diode chip, reaches the convex outer surface of the lens 40, that is, the interface of the lens 40 that contacts the atmosphere, the refracting surfaces of the refractive lenses 50 allow light to enter at an angle within the critical angle.

Therefore, light, emitted from the light emitting diode chip, is not totally reflected from the interface of the lens 40 and reflected back inside the lens 40, so that a reduction of light extraction efficiency can be prevented.

The refractive lenses 50 are formed at intersections of a plurality of horizontal lines 51 and vertical lines 52 that are depressed below the surface of the lens 40.

As shown in FIGS. 3 and 4, the refractive lenses 50 having the fly's eye pattern are arranged into a rectangular mesh by the plurality of horizontal lines 51 and vertical lines 52.

Each of the refractive lenses 50 is shaped like a dome and has a smaller sub-radius of curvature r like the dome-shaped lens 40 having the predetermined main radius of curvature R. As shown in FIG. 6, the specific design conditions of the refractive lenses 50 are substantially the same as those, illustrated with reference to FIGS. 1 and 2. Thus, a detailed description thereof will be omitted.

The numerical values for the design of the lens 40 and the refractive lenses 50, that is, the radius of curvature R and the height of the lens 40, and the shape (fly's eye pattern) and the sub-radius of curvature r of the refractive lens 50 may be optimized according to the conditions of the package body 10, such as a slope ($\theta$) of the reflective surface of the cavity 13 and the size thereof, and a distance to the light emitting diode chip 30.

As described above, according to the exemplary embodiment of the invention, a light emitting diode package includes a cavity having reflective surface with a predetermined slope in a package body that has a light emitting diode chip mounted therein and a lens having refractive lenses arranged in a fly's eye pattern on the top thereof along an dome-shaped surface, thereby increasing light extraction efficiency.

Particularly, as a plurality of refractive lenses arranged in a fly's eye pattern are formed on the outer surface of a lens, light emitted from the light emitting diode chip can be prevented from being totally reflected from the interface of the lens and being reflected back inside the lens, thereby increasing light extraction efficiency.

As set forth above, according to exemplary embodiments of the invention, a lens for a light emitting diode package and a light emitting diode package having the same have simple structures and show excellent optical characteristics by preventing light emitted from a light emitting diode chip from being internally reflected by a lens surface to increase light extraction efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A lens for a light emitting diode package that covers a light emitting diode chip mounted in a package body, the lens comprising:
   a plurality of refractive lenses each having a sub-radius of curvature smaller than one main radius of curvature of an outer surface of the lens protruding above the package body, and raised on the outer surface of the lens along the main radius of curvature,
   wherein a ratio of the sub-radius of curvature to the main radius of curvature of the refractive lenses satisfies the following equation, $$2\sqrt{2} < R/r,$$

where R is a main radius of curvature, and r is a sub-radius of curvature, and wherein a distance between the refractive lenses arranged in a fly's eye pattern and the sub-radius of curvature of the refractive lenses satisfy the following equation, $$d=r/2 \qquad \text{Equation 2,}$$

wherein d is a distance between refractive lenses, and r is a sub-radius of curvature.

2. The lens for a light emitting diode package of claim 1, wherein the refractive lenses are fly's eye lenses.

3. The lens for a light emitting diode package of claim 1, wherein the refractive lenses are provided at intersections of a plurality of horizontal lines and vertical lines depressed below the outer surface at predetermined intervals.

4. The lens for a light emitting diode package of claim 3, wherein the refractive lenses are arranged in a convex mesh by the plurality of horizontal lines and vertical lines.

* * * * *